(12) United States Patent
Mori

(10) Patent No.: US 6,537,906 B1
(45) Date of Patent: Mar. 25, 2003

(54) METHODS FOR FABRICATING SEMICONDUCTOR DEVICES

(75) Inventor: Katsumi Mori, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/438,166

(22) Filed: Nov. 11, 1999

(30) Foreign Application Priority Data

Nov. 13, 1998 (JP) .......................... 10-341104
Sep. 6, 1999 (JP) .......................... 11-251217

(51) Int. Cl.⁷ ............................ H01L 21/4763
(52) U.S. Cl. ............... 438/636; 438/636; 438/585; 438/778
(58) Field of Search ............... 438/636, 623, 438/634, 585, 592, 778, 780, 305, 197, 193, 700

(56) References Cited

U.S. PATENT DOCUMENTS

| 5,017,513 A | * | 5/1991 | Takeuchi ............ 438/780 |
| 5,728,508 A | | 3/1998 | Takemura et al. ...... 430/315 |
| 5,920,796 A | * | 7/1999 | Wang et al. .......... 438/700 |
| 6,004,722 A | | 12/1999 | Zhang ............... 430/271.1 |
| 6,004,853 A | * | 12/1999 | Yang et al. ........... 438/585 |
| 6,046,114 A | | 4/2000 | Tohda ............... 438/695 |
| 6,136,676 A | * | 10/2000 | Saito ............... 438/587 |

FOREIGN PATENT DOCUMENTS

| EP | 0605123 | 7/1994 | | |
| EP | 0820093 | 1/1998 | | |
| JP | 5-304167 | 11/1993 | | |
| JP | 6-020943 | 1/1994 | | |
| JP | 7-335869 | 12/1995 | | |
| JP | 8-153704 | 6/1998 | | |
| JP | 10-242117 | 9/1998 | | |
| JP | 10-303183 | 11/1998 | | |
| JP | 10-341104 | * 11/1998 | ........... H01L/21/47 |
| JP | 2000-31018 | 1/2000 | | |
| JP | 200031018 | * 1/2000 | ........... H01L/21/30 |

OTHER PUBLICATIONS

U.S. application Ser. No. 09/438,164, filed Nov. 11, 1999.
Translation of "Notice of Grounds for Rejection" re: Japanese 1999 Patent Application 251217, date of notice Apr. 4, 2001.
Ta et al., "A sub-micron deep-UV integrated ARC process", Proc. Electrochem. Soc. (1992) 92–18, pp. 460–471.

* cited by examiner

Primary Examiner—Carl Whitehead, Jr.
Assistant Examiner—Yennhu B. Huynh
(74) Attorney, Agent, or Firm—Konrad, Raynes, Victor & Mann, LLP; Alan S. Raynes

(57) ABSTRACT

Certain embodiments provide a method for fabricating a semiconductor device in which a conductive layer containing silicon can be etched in a predetermined shape without adversely affecting a gate insulating film. A method for fabricating a semiconductor device in accordance with the present invention includes forming an oxide film 24 on a p-type silicon substrate 10 and forming a polysilicon layer 26 on the oxide film 24. A stopper layer 28 is formed on the surface of the polysilicon layer 26 and an organic antireflection coating 30 is formed on the surface of the stopper layer 28. A resist layer R is formed on the surface of the organic antireflection coating 30. The method also includes etching the organic antireflection coating 30 using the resist layer R as a mask and etching the stopper layer 28. The polysilicon layer 26 is also etched in a predetermined pattern to form a gate electrode.

35 Claims, 5 Drawing Sheets

METHODS FOR FABRICATING SEMICONDUCTOR DEVICES

FIELD OF THE INVENTION

The present invention relates to semiconductor devices and methods for their manufacture, and more particularly, certain embodiments relate to etching a conductive layer containing silicon.

BACKGROUND

In the fabrication of a semiconductor device, for example, a gate electrode is formed by partially etching a conductive layer such as a polysilicon layer formed on a semiconductor substrate with an insulating film therebetween. Such etching is performed using a predetermined resist pattern, formed by photolithography, as a mask, in order to obtain predetermined shape and size. Therefore, it is an important technique to obtain a predetermined photo-pattern for forming gate electrodes. In accordance with the recent reduction in size of gate electrode structures, the following phenomenon has been occurring at a step in the end of a device-separation region. The phenomenon will be described with reference to FIGS. 8 and 9.

FIG. 8 is a sectional view of a device when a gate electrode is formed in the vicinity of a device-separation region. A first step 130a lies in the end of a device-separation region 112 formed on a silicon substrate 110 on the side of a gate oxide film 124. When a polysilicon layer 126 is deposited on the device-separation region 112 and the gate oxide film 124, a second step 130b is also generated in the polysilicon layer 126 lying above the first step 130a. With the second step 130b being present, for example, the following problem may occur.

In order to etch the polysilicon layer 126 in a predetermined shape, dry etching or the like is generally performed using a pattern formed with a resist as a mask. Resist patterning is performed by exposure and development of the resist. Consequently, in a resist layer R1 shown in FIG. 8, in order to remove a resist layer portion R1a in the region between chained lines A and B, the resist layer portion R1a only must be exposed if a positive resist is used. When the resist layer portion R1a between the chained lines A and B is exposed, the exposure light passes through the resist layer portion R1a and is reflected by the interface between the resist layer R1 and the polysilicon layer 126. Therefore, light reflected by the section having a horizontal surface of the polysilicon layer 126, such as a first exposure light 140a, is reflected in the opposite direction to the incident light. On the other hand, light reflected by the second step 130b, such as a second exposure light 140b, is reflected in various directions depending on the tilt angle of the second step 130b, and the reflected light may penetrate through a resist layer R1b which is required to remain, thus exposing the resist layer R1b. When the above is developed, as shown in FIG. 9, the end of the remaining resist layer R1b is missing and satisfactory patterning of the resist layer is not obtained.

In order to solve such a problem, Japanese Unexamined Patent Publication No. 8-153704 discloses a technique in which an organic antireflection coating is disposed between the polysilicon layer 126 and the resist layer R1. By providing such an organic antireflection coating, the organic antireflection coating absorbs the exposure light passing through the resist layer and prevents the exposure light from being reflected at the interface between the resist layer and the organic antireflection coating, and thus a resist mask having predetermined size and shape can be obtained.

However, the organic antireflection coating is not removed when the resist mask is formed, and remains on the polysilicon layer. Therefore, in order to etch the polysilicon layer using the resist mask, the organic antireflection coating must be etched in predetermined size and shape using the resist mask.

Consequently, in the fabrication of a gate electrode using an organic antireflection coating as well as using a resist mask formed by photolithography, two processes of etching are used, namely, etching of the organic antireflection coating in which size and shape are controlled using the resist mask; and etching of the gate electrode in which size and shape are controlled using a mask including the resist and the organic antireflection coating.

SUMMARY

One embodiment relates to a method for fabricating a semiconductor device including forming an insulating film on a semiconductor substrate and forming a conductive layer containing silicon on the insulating film. A stopper layer is formed on the conductive layer and an organic antireflection coating formed on the stopper layer. A resist layer having a predetermined pattern is formed on the organic antireflection coating. The method also includes etching the organic antireflection coating using the resist layer as a mask, as well as etching the stopper layer and etching the conductive layer in a predetermined pattern to form a gate electrode.

Certain other embodiments relate to method for fabricating a semiconductor device including forming an insulating film on a semiconductor substrate and forming a conductive layer on the insulating film. A stopper layer is formed on the conductive layer and an antireflection coating is formed on the stopper layer. A resist layer having a predetermined pattern is formed on the antireflection coating. The method also includes etching the antireflection coating using the resist layer as a mask, as well as etching the stopper layer and etching the conductive layer in a predetermined pattern.

Additional embodiments relate to a method for fabricating a semiconductor device including forming an insulating film on a semiconductor substrate and forming a conductive layer containing silicon on the insulating film. A stopper layer is formed on the conductive layer and an organic antireflection coating formed on the stopper layer. The organic antireflection coating is etched and the stopper layer is etched. In addition, the conductive layer is etched in a predetermined pattern.

Embodiments also relate a gate electrode including an insulating film on a substrate and a conducting layer on the insulating film. The gate electrode also includes a stopper layer on the conducting layer, the stopper layer being a material having a lower etching rate than an organic antireflection material when subjected to an etching gas comprising oxygen and chlorine.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
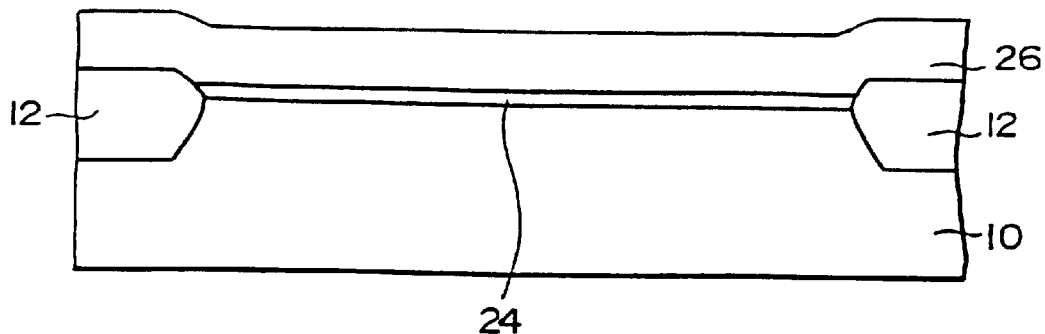
FIG. 1 is a sectional view which schematically shows a step of a manufacturing method for a semiconductor device in accordance with an embodiment of the present invention.

One object of certain embodiments of the present invention is to provide a method for fabricating a semiconductor device using a resist layer and an organic antireflection coating as etching masks, in which a conductive layer containing silicon can be etched in a predetermined shape without adversely affecting a gate insulating film.

A method for fabricating a semiconductor device in accordance with one embodiment of the present invention includes the following steps (a) to (h):

(a) forming an insulating film on a semiconductor substrate;

(b) forming a conductive layer containing silicon on the insulating film;

(c) forming a stopper layer on the conductive layer;

(d) forming an organic antireflection coating on the stopper layer;

(e) forming a resist layer having a predetermined pattern on the organic antireflection coating;

(f) etching the organic antireflection coating, using the resist layer as a mask;

(g) etching the stopper layer; and (h) etching the conductive layer in a predetermined pattern to form a gate electrode.

The present inventors research has shown that it is very difficult to control size and shape when an organic antireflection coating is etched. This is because the typical material constituting a resist mask is similar to the material constituting the organic antireflection coating, and the resist layer as a mask is also etched while the organic antireflection coating is etched, resulting in variations in shape and size.

The present inventors formed an organic antireflection coating directly on the surface of a conductive layer containing silicon. The present inventors performed a method in which the organic antireflection coating was etched in predetermined size and shape using a resist as a mask with high-density plasma dry etching. By controlling the size and shape of the organic antireflection coating, the following was found. That is, pinhole etching defects occurred on the top of the conductive layer containing silicon in the periphery of the resist. In the subsequent etching of the conductive layer, the shapes of the pinhole etching defects were transferred to the gate insulating film, generating holes passing through the gate insulating film.

In accordance with certain preferred embodiments of the present invention, by providing a stopper layer on the surface of the conductive layer, pinhole etching defects do not occur on the top of the conductive layer, even when etching is performed, so as to form the organic antireflection coating in a predetermined shape. Consequently, a fine gate electrode structure in which the gate insulating film does not have pinholes can be obtained after the subsequent etching.

By providing the stopper layer, pinhole etching defects do not occur on the top of the conductive layer because the stopper layer prevents the conductive layer and an etching gas from being brought into direct contact with each other while the organic antireflection coating is etched.

As a material for the stopper layer, any material having a lower etching rate than that of the organic antireflection coating may be used. Thus, although an inorganic material, a metal thin film, or the like may be used, when employed in a silicon semiconductor, in view of the relationship with the subsequent processes, presently preferred examples of materials for the stopper layer include silicon oxide and silicon nitride. Silicon oxide is presently preferred since it has good adhesion to polysilicon as a gate electrode and to single crystal silicon as a substrate, the formation method is easy, and as will be described below, a very thin layer can be produced.

The stopper layer should have a thickness sufficient to prevent the exposure of the surface of the underlying conductive layer until the organic antireflection coating is entirely etched. In view of film thickness controllability and uniformity during the formation of the stopper layer, the stopper layer preferably has a thickness of 10 angstroms (1 nm) or more. When the thickness of the stopper layer is increased, although the exposure of the underlying conductive layer does not occur when the organic antireflection coating is etched, after the etching of the organic antireflection coating is completed, the stopper layer must be etched under optimized etching conditions, resulting in complex processes, or causing variation in gate sizes or the like. Therefore, the stopper layer preferably has a thickness of 100 angstroms (10 nm) or less, which does not require special etching for the stopper layer.

The organic antireflection coating preferably has an organic substance as a major constituent and a reflectance of 5% or less for light of a predetermined wavelength.

An etching gas used for etching the organic antireflection coating preferably contains at least an oxygen-based gas and a chlorine-based gas due to the reasons described below.

The organic antireflection coating includes an organic substance and reacts with oxygen. Thus, when the organic antireflection coating is etched, oxygen is generally used as an etching gas. In plasma etching using oxygen, since there is no great physical damage, which is feared in plasma dry etching, the organic antireflection coating can be very effectively etched. However, when the organic antireflection coating is etched using a resist layer as a mask, since the resist layer is composed of an organic substance, similar to the organic antireflection coating, if etching is performed with oxygen-based gas only, the resist layer is also etched when the organic antireflection coating is etched. Since the etching in the resist layer will generally advance isotropically, the size of the resist layer differs before and after the etching. However, if the etching gas contains chlorine-based gas, chlorine ions in the plasma react with carbon constituting the resist layer and the antireflection coating to form a reaction product, and a protective film composed of the reaction product is formed on the sidewalls of the resist layer. The formation of the protective film and etching by oxygen ions and oxygen radicals in the plasma may be balanced, and thus etching does not advance in the transverse direction of the resist layer. Therefore, the organic antireflection coating can be etched without changing the size of the resist layer.

When the etching gas contains the oxygen-based gas and the chlorine-based gas, the ratio of the number of chlorine atoms to the number of oxygen atoms (number of chlorine atoms/number of oxygen atoms) (hereinafter referred to as a "molar ratio") is preferably set at 0.5 to 5. If the molar ratio is less than 0.5, oxygen ions and oxygen radicals in the plasma are increased, and the etching amount becomes greater than the amount of the protective film formed by the reaction product of chlorine and carbon, thus reducing the size of the resist mask. Since oxygen ions and oxygen radicals are set to easily advance to the side of the substrate and not to easily advance to the side of the sidewall of the resist layer, the reaction rate on the side of the substrate is higher, and thus, the preferred molar ratio is 0.5 or more. On the other hand, if the molar ratio exceeds 5, in contrast to the above, chlorine ions in the plasma are increased, and the protective film formed on the sidewall of the resist layer becomes too thick, and thus the width of the resist layer is increased, resulting in difficulty in forming a gate electrode having a predetermined size.

Preferably, the chlorine-based gas contains at least one gas selected from the group consisting of $Cl_2$, $CCl_4$, HCl, and $BCl_3$. By using such a chlorine-based gas, a satisfactory protective film can be formed. Preferably, the oxygen-based gas contains at least one gas selected from the group consisting of oxygen, ozone, and carbon monoxide. By using such an oxygen-based gas, the organic antireflection coating can be satisfactorily etched.

An etching gas in the step (f) may contain at least one element selected from the group consisting of argon, helium, and nitrogen.

The selective ratio of the organic antireflection coating to the stopper layer (etching rate of organic antireflection coating/etching rate of stopper layer) is preferably set at 5 or more. By setting the selective ratio at 5 or more, the stopper layer reliably performs its function as a stopper even when the organic antireflection coating is subjected to overetching.

Etching in the step (f) may be dry etching.

The pressure of etching (hereinafter referred to as an "etching pressure") is preferably set at 1 to 10 mTorr. If the etching pressure is less than 1 mTorr, it is difficult to maintain a stable plasma. On the other hand, if the etching pressure exceeds 10 mTorr, isotropic plasma etching is intensified, the protective film formed on the sidewall of the resist layer becomes too thick, and the width of the resist layer changes, resulting in difficulty in forming a gate electrode of a predetermined size.

Etching in the step (f) is preferably performed by high-density plasma etching which generates a stable plasma in the range from 1 to 10 mTorr described above. The high-density plasma is preferably a plasma having an ion density of about $1 \times 10^{11}$ cm$^{-3}$ or greater.

The step (f) and the step (g) may be performed successively. Furthermore, the step (f), the step (g), and the step (h) may be performed successively. When the step (f) and the step (g) are performed successively, an etching gas used in the step (g) preferably includes a fluorine-based gas.

Preferred embodiments of the present invention will be described below with reference to the drawings.

The fabrication process for a semiconductor device 100 shown in FIG. 6 will be described. FIGS. 1 to 6 show the fabrication steps for the semiconductor device 100.

First, description will be made with reference to FIG. 1. Device-separation regions 12 composed of a silicon oxide film are formed on the predetermined surface of a p-type silicon substrate 10 by a known method. Next, an oxide film 24 is formed over the device region delimited by the device-separation regions 12. A portion of the oxide film 24 is to become a gate oxide film 16. Although the thickness of the oxide film 24 differs depending on the desired device characteristics, for example, the oxide film 24 may have a thickness of 30 to 80 angstroms (3 to 8 nm). A polysilicon layer 26 is preferably formed on the device-separation regions 12 and the oxide film 24 by a CVD method or the like. The polysilicon layer 26 is doped with impurities and has low resistance. A portion of the polysilicon layer 26 is to become a gate electrode 18.

Figure 2:
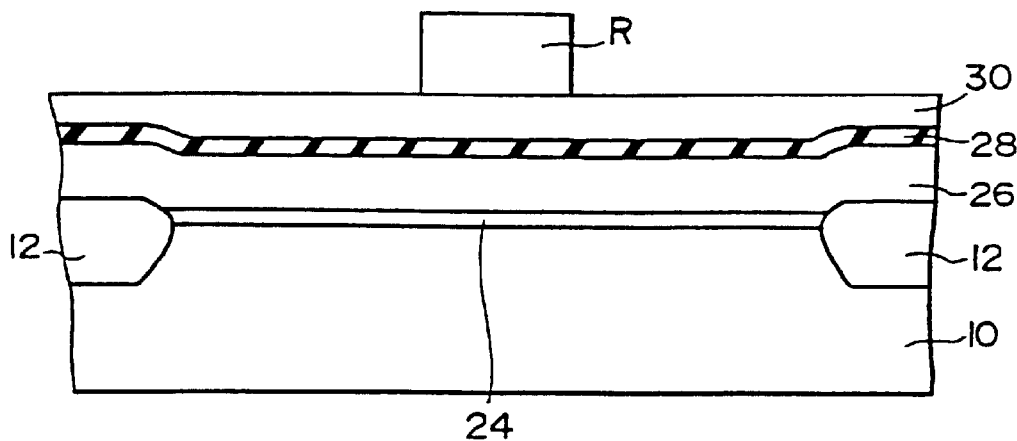
FIG. 2 is a sectional view which schematically shows a step of a manufacturing method for a semiconductor device in accordance with an embodiment of the present invention.

Next, description will be made with reference to FIG. 2. A stopper layer 28 is formed on the polysilicon layer 26. As a material for the stopper layer 28, for example, silicon oxide is preferably used, and in addition to silicon oxide, other materials such as, for example, silicon nitride, titanium nitride, titanium, or tungsten may be used. The function of the stopper layer 28 will be described below. The thickness of the stopper layer 28 is not specifically limited as long as the stopper layer 28 can perform its function. Preferably, the stopper layer 28 has a thickness of 10 to 100 angstroms (1 to 10 nm). By setting the thickness of the stopper layer 28 at 10 angstroms (1 nm) or more, the function as the stopper layer 28 can be performed more reliably. The reason that the thickness is preferably 100 angstroms (10 nm) or less will be described below. Although a method for forming the stopper layer 28 is not specifically limited, in view of simplicity, controllability, etc., a CVD method may preferably be used. When the stopper layer 28 is composed of silicon oxide, an oxygen plasma treatment method, a thermal oxidation method, or the like, may also be employed.

An organic antireflection coating 30 having a preferred thickness of 500 to 1,500 angstroms (50 to 150 nm) is formed on the stopper layer 28. The organic antireflection coating 30 preferably has an organic substance as a major constituent and has a preferred reflectance of 5% or less, more preferably 3% or less, for light of a predetermined wavelength. The organic antireflection coating 30 is formed, for example, by spin coating, and the thickness is optimized according to the reflectance of the underlying layer and a desired resist size. The organic antireflection coating 30 may be composed of an organic polymeric resin and one or more additives, etc., similar to a resist material.

A photoresist is applied on the organic antireflection coating 30. The photoresist is then subjected to patterning by photolithography. Thus, as shown in FIG. 2, a resist layer R having a predetermined pattern is formed.

Figure 3:
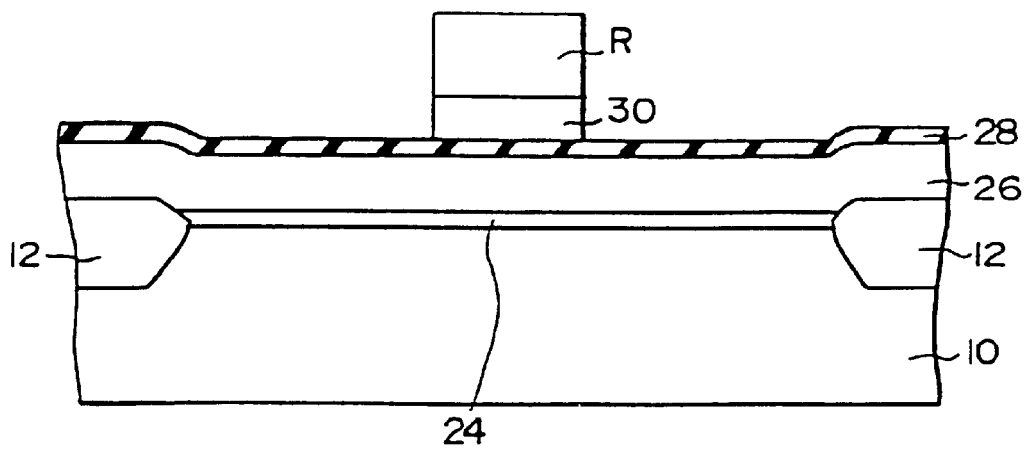
FIG. 3 is a sectional view which schematically shows a step of a manufacturing method for a semiconductor device in accordance with an embodiment of the present invention.

Next, as shown in FIG. 3, the organic antireflection coating 30 is etched using the resist layer R as a mask. The etching may be performed by dry etching, and preferably, by high-density plasma etching. The high-density plasma is a plasma having an ion density of about $1 \times 10^{11}$ cm$^{-3}$ or more.

In the present embodiment, even when the organic antireflection coating 30 is etched, pinhole etching defects do not occur on the top of the polysilicon layer 26 in the periphery of the resist layer R. The reason for this is that the stopper layer 28 is disposed between the organic antireflection coating 30 and the polysilicon layer 26. That is, the stopper layer 28 inhibits the polysilicon layer 26 from coming into contact with an etching gas for etching the organic antireflection coating 30, and thus, even when the organic antireflection coating 30 is etched under suitable conditions, pinhole etching defects are inhibited on the top of the polysilicon layer 26.

The organic antireflection coating 30 is preferably etched by high-density plasma etching, and the etching is preferably performed so as to satisfy the following conditions.

Although the plasma etching gas is not specifically limited, a mixture of a chlorine-based gas and an oxygen-based gas is preferably used. The chlorine-based gas may include, for example, $Cl_2$, $CCl_4$, HCl, and $BCl_3$. The oxygen-based gas may include, for example, oxygen, ozone, and carbon monoxide.

Since the plasma etching gas is preferably a mixture of a chlorine-based gas and an oxygen-based gas, the organic antireflection coating 30 can be selectively etched while the etching of the sidewall of the resist layer R is minimized. The reason for the above is as follows.

The organic antireflection coating 30 includes an organic substance. Therefore, by means of a plasma using the oxygen-based gas, the organic antireflection coating 30 can be removed by etching. On the other hand, the resist layer R is also composed of an organic substance, similar to the organic antireflection coating 30. Therefore, when the organic antireflection coating 30 is etched by plasma etching using an oxygen-based gas as the plasma etching gas and using the resist layer R as a mask, the resist layer R may be also isotropically etched. However, if the plasma etching gas is a mixture of an oxygen-based gas and a chlorine-based gas, chlorine ions in the plasma react with carbon in the resist layer R and the organic antireflection coating 30 to form a reaction product. The reaction product adheres to the surface of the resist layer R. The reaction product adhered to the sidewall of the resist layer R functions as a protective film for the resist layer R during etching. Hereinafter, the reaction product adhered to the sidewall of the resist layer R is referred to as a "protective film". The reaction product adhered to the top surface of the resist layer R is removed by bombardment by ions in the plasma during etching. The formation of the protective film and etching by oxygen ions and oxygen radicals in the plasma are balanced, and thus etching does not advance in the transverse direction of the resist layer R. Consequently, by using a mixture of the oxygen-based gas and the chlorine-based gas as an etching gas, the organic antireflection coating 30 can be selectively etched while minimizing the etching of the sidewall of the resist layer R.

When the etching gas is a mixture of a chlorine-based gas and an oxygen-based gas, the molar ratio (number of chlorine atoms/number of oxygen atoms) is preferably set at 0.5 to 5, and more preferably, at 1 to 3. If the molar ratio is less than 0.5, oxygen ions and oxygen radicals in the plasma are increased, and the etching amount becomes greater than the amount of the protective film formed by the reaction product of chlorine and carbon, thus reducing the size of the resist mask. Oxygen ions and oxygen radicals are set to easily advance to the side of the substrate and not to easily advance to the side of the sidewall of the resist layer so that the organic antireflection coating is easily etched. That is, by applying a bias voltage to the substrate during etching, oxygen ions are attracted in the direction perpendicular to the surface of the substrate on which the resist layer is formed. Oxygen radicals are also attracted in the direction perpendicular to the surface of the substrate on which the resist layer is formed by the influence of ions such as oxygen ions which have been attracted thereto. Consequently, the etching rate of the organic antireflection coating 30 is higher than that of the sidewall of the resist layer R. Therefore, the required molar ratio is preferably 0.5 or more. On the other hand, if the molar ratio exceeds 5, in contrast to the above, chlorine ions in the plasma are increased, and the protective film formed on the sidewall of the resist layer becomes too thick, and thus the width of the resist layer is increased, resulting in difficulty in forming a gate electrode having a predetermined size.

The selective ratio of the organic antireflection coating 30 to the stopper layer 28 (etching rate of organic antireflection coating/etching rate of stopper layer) by the mixed gas within the ranges described above is not specifically limited as long as the function as the stopper layer 28 can be performed. The selective ratio is preferably set at 5 or more, and more preferably, at 10 or more. By setting the selective ratio at 5 or more, the stopper layer reliably performs its function even when the organic antireflection coating 30 is subjected to overetching. That is, when the organic antireflection coating 30 is subjected to overetching, the stopper layer 28 is not removed entirely in the depth direction, thus more reliably preventing the polysilicon layer 26 from being exposed. Consequently, the selective ratio of 5 or more ensures that the etching gas comprising a mixed gas is not brought into contact with the polysilicon layer 26.

When a mixed gas of the oxygen-based gas and the chlorine-based gas is used as the plasma etching gas, various other gases may be added to the mixed gas. Added gases may include, for example, argon, helium, and nitrogen. The added gases are used for improving the stability of the plasma and for improving the density variations of the resist pattern.

The etching pressure is preferably set at 1 to 10 mTorr, and more preferably, at 3 to 6 mTorr. If the etching pressure is less than 1 mTorr, it is difficult to maintain a stable plasma. On the other hand, if the etching pressure exceeds 10 mTorr, isotropic plasma etching is intensified, the protective film formed on the sidewall of the resist layer becomes too thick, and the width of the resist layer changes, resulting in difficulty in forming a gate electrode having a predetermined size.

The method for etching the organic antireflection coating 30 is not limited to high-density plasma etching, and any known dry etching may be employed.

Figure 4:
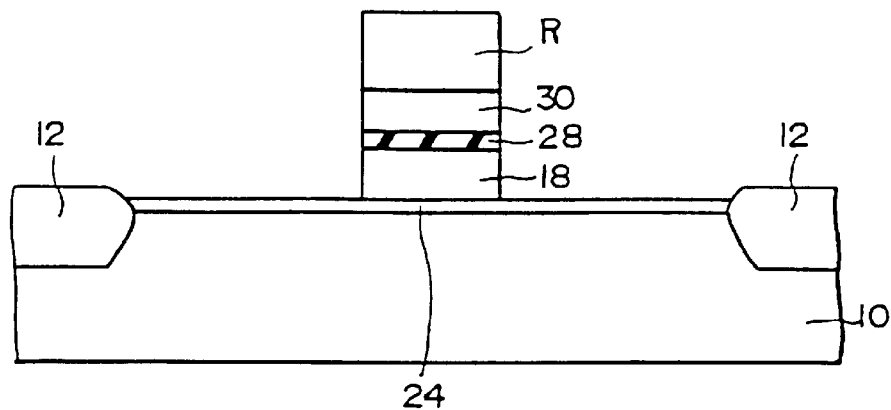
FIG. 4 is a sectional view which schematically shows a step of a manufacturing method for a semiconductor device in accordance with an embodiment of the present invention.

Next, description will be made with reference to FIG. 4. First, the stopper layer 28 is etched. When the organic antireflection coating 30 is etched by high-density plasma etching as described above, the stopper layer 28 may be etched by high-density plasma etching successively in the same system by changing the etching gas to a fluorine-based gas, such as a fluorocarbon. As the fluorocarbon, for example, $CF_4$, $C_2F_6$, $CHF_3$, and $CH_2F_2$ may be used.

With respect to the etching of the stopper layer 28, preferably, changes in the shape of the resist layer R during etching are also minimized. Therefore, a thinner stopper layer 28 is desirable because etching is completed quickly, and preferably, the stopper layer 28 has a thickness of 100 angstroms (10 nm) or less.

Next, the polysilicon layer 26 is etched. At this stage, an etching method is preferably selected so as not to etch the gate oxide film 24. A known method such as reactive ion etching may be employed, in which oxygen and hydrogen bromide are used as etching gases. Thus, the polysilicon layer 26 is patterned to form a gate electrode 18.

All the etchings described above, namely, the etchings of the organic antireflection coating 30, the stopper layer 28, and the polysilicon layer 26, may be performed by high-density plasma etching, and by changing the etching gas for each etching, the etching may be performed successively in the same system.

Figure 5:
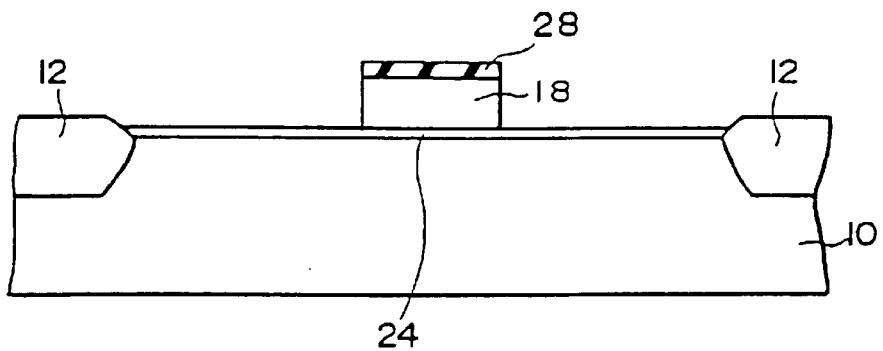
FIG. 5 is a sectional view which schematically shows a step of a manufacturing method for a semiconductor device in accordance with an embodiment of the present invention.
Figure 6:
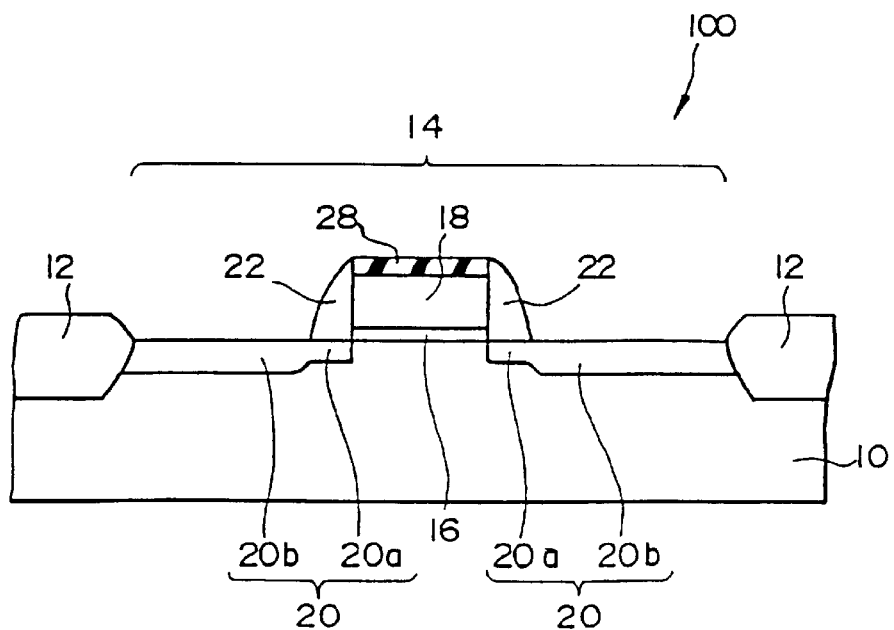
FIG. 6 is a sectional view which schematically shows a step of a manufacturing method for a semiconductor device in accordance with an embodiment of the present invention.

Next, as shown in FIG. 5, the organic antireflection coating 30 and the resist layer R on the stopper layer are removed, for example, by ashing using oxygen.

Next, description will be made with reference to FIG. 6. First, a n-type impurity diffusion layer 20a having a low density for constituting source/drain regions is formed by implanting ions, such as phosphorus ions, into predetermined regions in the p-type silicon substrate 10, using a photoresist mask.

Next, sidewall insulating films 22 are formed on both sides of the gate electrode 18 in the following manner. An insulating layer (not shown in the drawing) composed of, for example, a silicon oxide film or silicon nitride film is formed on the entire surface by a CVD method or the like. The insulating layer is then subjected to anisotropic etching by reactive ion etching or the like to form the sidewall insulating films 22.

Next, a n-type impurity diffusion layer 20b having a high density is formed by ion-implanting impurities such as arsenic into the p-type silicon substrate 10, using the gate electrode 18 and the sidewall insulating films 22 as masks. Thus, a n-type impurity diffusion layer 20 having a LDD structure is formed. In such a manner, a MOS device 14 is formed in the device region delimited by the device-separation regions 12, and the semiconductor device 100 in accordance with an embodiment of the present invention is completed.

FIG. 6 shows a schematic sectional view of the semiconductor device 100. The semiconductor device 100 includes the device-separation regions 12 and the n-type MOS device 14.

The device-separation regions 12 are formed for separating devices and delimits the device region. The MOS device 14 includes the gate oxide film 16, the gate electrode 18, and the n-type impurity diffusion layer 20.

The gate oxide film 16 is formed on the p-type silicon substrate 10. The gate electrode 18 is formed on the gate oxide film 16. The gate electrode 18 is composed of the polysilicon layer and is doped with impurities. The stopper layer 28 is formed on the gate electrode 18. The sidewall insulating films 22 are formed so as to cover the sidewalls of the gate oxide film 16, the gate electrode 18, and the stopper layer 28.

The n-type impurity diffusion layer 20 comprises source/drain regions. The n-type impurity diffusion layer 20 includes the n-type impurity diffusion layer 20a having a low density and the n-type impurity diffusion layer 20b having a high density, and has a LDD structure.

A feature of the semiconductor device 100 in accordance with one preferred embodiment of the present invention is that the organic antireflection coating 30 is etched with the stopper layer 28 being disposed between the organic antireflection coating 30 and the polysilicon layer 26. The stopper layer 28 prevents the polysilicon layer 26 from being in contact with the etching gas during etching the organic antireflection coating. Thus, when the organic antireflection coating 30 is removed by etching, the etching does not cause pinhole etching defects on the top of the polysilicon layer 26 in the periphery of the resist layer R. Consequently, a fine gate electrode structure in which the gate oxide film 16 does not have defects such as through-holes can be obtained.

With respect to etching of an organic antireflection coating, the relationship between the CD (Critical Dimension) shift and the etching pressure was investigated and the following results were obtained. The CD shift corresponds to a value that is obtained by subtracting, from the dimension at a predetermined section of a resist mask pattern formed by photolithography, the dimension of the same section after the organic antireflection coating has been etched. The etching was performed with an etching system having a high-density plasma source. As an etching gas, a gas comprising chlorine and oxygen was used, and the flow ratio of chlorine to oxygen was set at 1:1.

Figure 7:
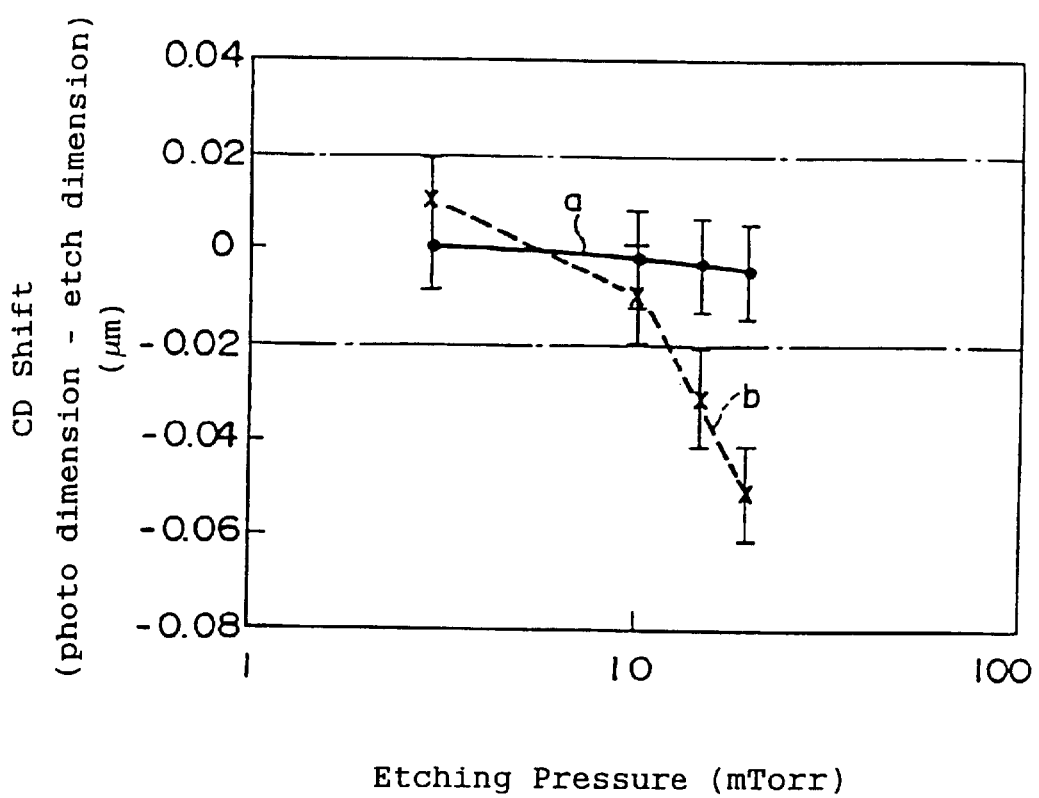
FIG. 7 is a graph which shows a relationship between the CD shift and the etching pressure.
Figure 8:
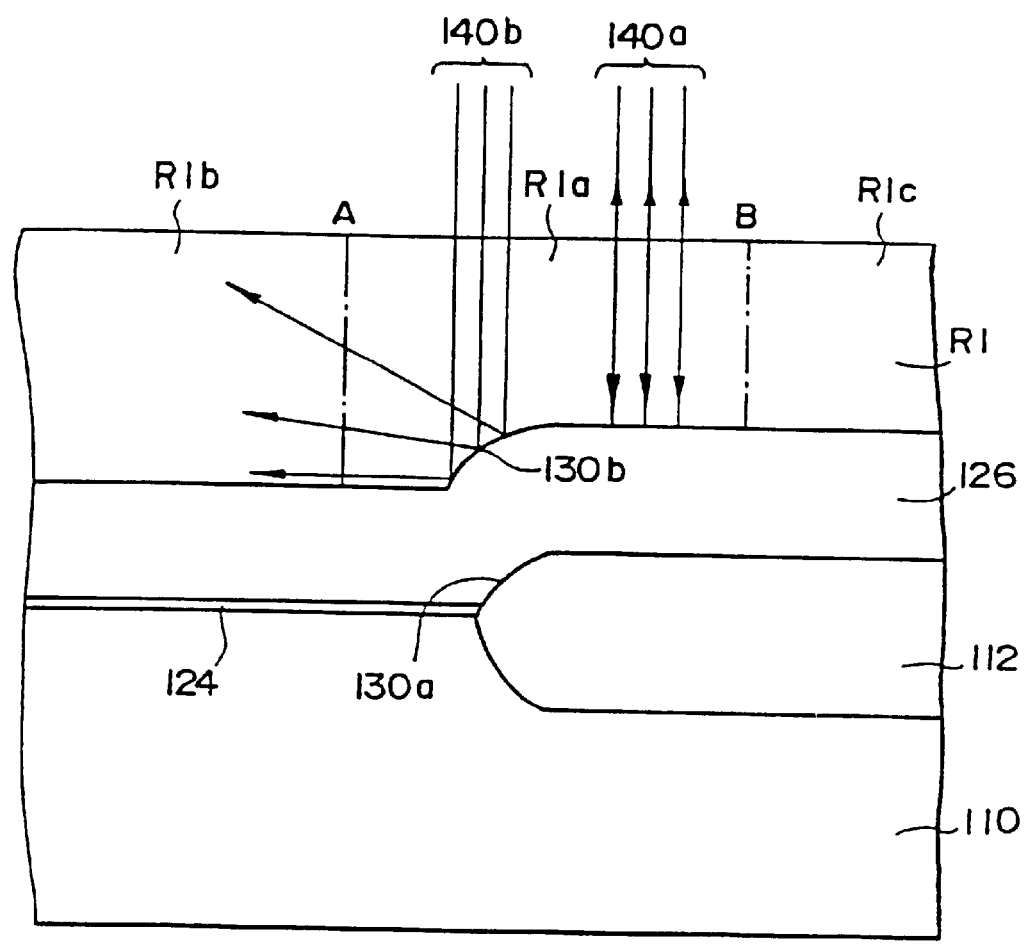
FIG. 8 is a schematic diagram which shows the state of reflection of exposure light when a resist layer formed on a polysilicon layer having steps are exposed.
Figure 9:
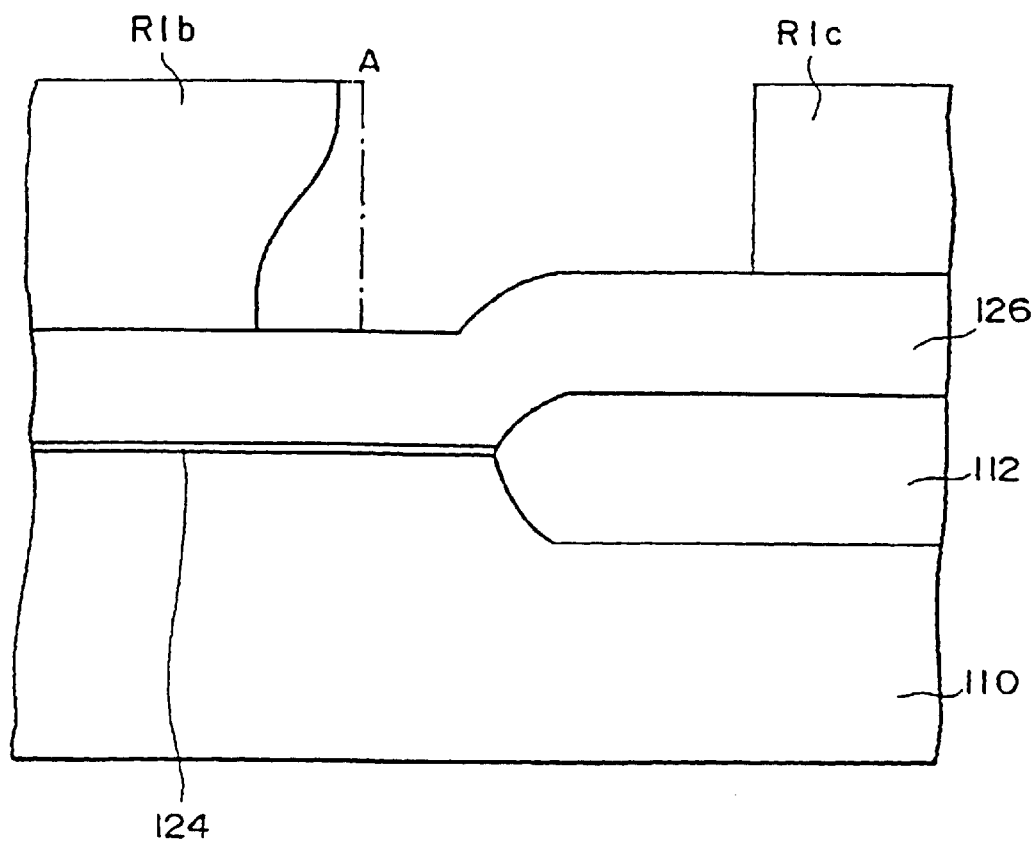
FIG. 9 is a schematic diagram which shows the remaining resist layer after the resist layer shown in FIG. 8 is developed.

FIG. 7 is a graph showing a relationship between the CD shift and the etching pressure. The solid line (represented by symbol a) shows the test results for a section in which lines having widths of 0.25 μm were repeatedly formed with a space of 0.25 μm (dense section). The dashed line (represented by symbol b) shows the test results for a section in which lines having widths of 0.25 μm were repeatedly formed with a space of 30 μm (sparse section).

As is obvious from FIG. 7, in the dense section, the CD shift is not greatly influenced by the etching pressure. On the other hand, in the sparse section, the CD shift decreases as the etching pressure is increased, and the CD shift is more greatly influenced by change in the etching pressure in comparison with the dense section.

Currently, it is considered to be preferable that the CD shift be within the range of approximately 10% of the width of the resist mask. From FIG. 7, it has been found that the etching pressure is preferably 10 mTorr or less so that the resist mask is confined within the above range.

Although the stopper layer 28 remains on the gate electrode 18 in the embodiment described above, the stopper layer 28 may be removed if desired.

Within the scope not deviating from the object of the present invention, various alterations can be made to the embodiment described above. For example, the invention is also applicable to a p-type MOS. A variety of materials may be utilized for the various layers. For example, the gate electrode is not limited to polysilicon, and a silicon intermetallic compound or the like is also applicable.

What is claimed:

1. A method for fabricating a semiconductor device comprising:
    forming an insulating film on a semiconductor substrate;
    forming a conductive layer comprising silicon on the insulating film;
    forming a stopper layer directly on the conductive layer;
    forming an organic antireflection coating directly on the stopper layer;
    forming a resist layer having a predetermined pattern on the organic antireflection coating;
    etching the organic antireflection coating using the resist layer as a mask;
    etching the stopper layer; and
    etching the conductive layer in a predetermined pattern to form a gate electrode.

2. A method for fabricating a semiconductor device according to claim 1, wherein the stopper layer comprises a material selected from the group consisting of silicon oxide and silicon nitride.

3. A method for fabricating a semiconductor device according to claim 1, wherein the stopper layer has a thickness of 10 to 100 angstroms.

4. A method for fabricating a semiconductor device according to claim 1, wherein the organic antireflection coating comprises an organic substance as a major constituent and has a reflectance of 5% or less for light of a predetermined wavelength.

5. A method for fabricating a semiconductor device according to claim 1, wherein etching the organic antireflection coating, using the resist layer as a mask, includes using an etching gas that comprises at least an oxygen-based gas and a chlorine-based gas.

6. A method for fabricating a semiconductor device according to claim 5, wherein the etching gas includes a ratio of the number of chlorine atoms to the number of oxygen atoms of 0.5 to 5.

7. A method for fabricating a semiconductor device according to claim 6, wherein the chlorine-based gas comprises at least one selected from the group consisting of $Cl_2$, $CCl_4$, HCl, and $BCl_3$.

8. A method for fabricating a semiconductor device according to claim 6, wherein the oxygen-based gas comprises at least one selected from the group consisting of oxygen, ozone, and carbon monoxide.

9. A method as in claim 5, wherein the etching gas further comprises at least one gas selected from the group consisting of argon, helium and nitrogen.

10. A method for fabricating a semiconductor device according to claim 1, wherein etching the organic antireflection coating using the resist layer as a mask, includes using an etching gas that comprises at least one gas selected from the group consisting of argon, helium, and nitrogen.

11. A method for fabricating a semiconductor device according to claim 1, wherein the selective ratio of the etching rate of the organic antireflection coating to the etching rate of the stopper layer is 5 or more.

12. A method for fabricating a semiconductor device according to claim 1, wherein etching the organic antireflection coating, using the resist layer as a mask, comprises dry etching.

13. A method for fabricating a semiconductor device according to claim 1, wherein the pressure of etching in etching the organic antireflection coating using the resist layer as a mask, is 1 to 10 mTorr.

14. A method for fabricating a semiconductor device according to claim 1, wherein etching the organic antireflection coating using the resist layer as a mask comprises high-density plasma dry etching.

15. A method for fabricating a semiconductor device according to claim 14, wherein the high-density plasma has an ion density of at least $1 \times 10^{11}$ cm$^{-3}$.

16. A method for fabricating a semiconductor device according to claim 1, wherein etching the organic antireflection coating using the resist layer as a mask and etching the stopper layer are performed successively.

17. A method for fabricating a semiconductor device according to claim 16, wherein an etching gas used in etching the stopper layer comprises a fluorine-based gas.

18. A method for fabricating a semiconductor device according to claim 1, wherein etching the organic antireflection coating using the resist layer as a mask, etching the stopper layer, and etching the conductive layer in a predetermined pattern to form a gate electrode are performed successively.

19. A method as in claim 1, wherein the stopper layer comprises a metal.

20. A method for fabricating a semiconductor device comprising:

forming an insulating film on a semiconductor substrate;

forming a conductive layer directly on the insulating film;

forming a stopper layer directly on the conductive layer;

forming an antireflection coating directly on the stopper layer;

forming a resist layer having a predetermined pattern directly on the antireflection coating;

etching the antireflection coating using the resist layer as a mask;

etching the stopper layer; and etching the conductive layer in a predetermined pattern.

21. A method as in claim 20, wherein the conductive layer is etched in a predetermined pattern to form a gate electrode.

22. A method as in claim 20, wherein etching the antireflection coating is carried out using a gas comprising at least one of an oxygen-based gas and a chlorine-based gas.

23. A method as in claim 22, wherein the gas used to etch the antireflection coating has an etching rate of the antireflection coating that is at least 5 times the etching rate of the stopper layer.

24. A method as in claim 23, where the gas used to etch the antireflection coating further comprises at least one gas selected from the group consisting of argon, helium and nitrogen.

25. A method as in claim 20, further comprising removing the resist layer and the antireflection coating after etching the conductive layer in a predetermined pattern.

26. A method for fabricating a semiconductor device comprising:

forming an insulating film on a semiconductor substrate;

forming a conductive layer comprising silicon on the insulating film;

forming a stopper layer in direct contact with the conductive layer;

forming an organic antireflection coating in direct contact with the stopper layer;

etching the organic antireflection coating;

etching the stopper layer; and etching the conductive layer in a predetermined pattern.

27. A method as in claim 26, wherein the conductive layer comprises a silicon intermetallic compound.

28. A method as in claim 26, wherein the conductive layer comprises polysilicon.

29. A method as in claim 28, wherein etching the conductive layer in a predetermined pattern is carried out to form a gate electrode.

30. A method as in claim 26, wherein the stopper layer comprises at least one material selected from the group consisting of a conductor, an insulator, and a semiconductor.

31. A method for fabricating a semiconductor device comprising:

forming an insulating film on a semiconductor substrate;

forming a conductive layer on the insulating film;

forming a stopper layer directly on the conductive layer;

forming an organic antireflection coating directly on the stopper layer;

forming a resist layer having a predetermined pattern on the organic antireflection coating;

etching the organic antireflection coating using the resist layer as a mask, the etching being carried out in a predetermined pressure and predetermined ion density, the predetermined pressure being in the range of 1 to 10 mTorr, the predetermined ion density being at least $1 \times 10^{11}$ cm$^{-3}$;

etching the stopper layer using at least the organic antireflection coating as a mask; and etching the conductive layer using at least the stopper layer as a mask.

32. A method for fabricating a semiconductor device according to claim 31, wherein the stopper layer has a thickness of 10 to 100 angstroms.

33. A method for fabricating a semiconductor device according to claim 31, wherein etching the organic antireflection coating, using the resist layer as a mask, includes using an etching gas that comprises an oxygen-based gas, a chlorine-based gas, and at least one gas selected from the group consisting of argon, helium, and nitrogen.

34. A method for fabricating a semiconductor device according to claim 31, wherein the selective ratio of the etching rate of the organic antireflection coating to the etching rate of the stopper layer is at least 5.

35. A method as in claim 31, wherein the stopper layer is etched in a gas composition that differs from that used to etch the conducting layer.

* * * * *